US010266394B2

(12) United States Patent
Hoekstra

(10) Patent No.: US 10,266,394 B2
(45) Date of Patent: Apr. 23, 2019

(54) INTEGRATED MEMS TRANSDUCERS

(71) Applicant: Cirrus Logic International Semiconductor Ltd., Edinburgh (GB)

(72) Inventor: Tsjerk Hans Hoekstra, Balerno (GB)

(73) Assignee: Cirrus Logic, Inc., Austin, TX (US)

(*) Notice: Subject to any disclaimer, the term of this patent is extended or adjusted under 35 U.S.C. 154(b) by 0 days.

(21) Appl. No.: 15/417,705

(22) Filed: Jan. 27, 2017

(65) Prior Publication Data

US 2017/0217762 A1 Aug. 3, 2017

Related U.S. Application Data

(60) Provisional application No. 62/288,699, filed on Jan. 29, 2016.

(30) Foreign Application Priority Data

Apr. 1, 2016 (GB) .................................. 1605567.5

(51) Int. Cl.
*B81B 7/00* (2006.01)
*H04R 19/00* (2006.01)
(Continued)

(52) U.S. Cl.
CPC ........ *B81B 7/0061* (2013.01); *B81C 1/00246* (2013.01); *B81C 1/00309* (2013.01);
(Continued)

(58) Field of Classification Search
CPC .......... B81B 7/0061; B81B 2201/0257; B81B 2203/0315; B81B 2207/012;
(Continued)

(56) References Cited

U.S. PATENT DOCUMENTS

2005/0127499 A1 6/2005 Harney et al.
2005/0127525 A1 6/2005 Alie et al.
(Continued)

FOREIGN PATENT DOCUMENTS

DE 102010006132 A1 8/2011
WO 2002073691 A1 9/2002
(Continued)

OTHER PUBLICATIONS

Search and Examination Report under Sections 17 and 18(3), U.K. Intellectual Property Office, Application No. GB1605567.5, dated May 25, 2017.

(Continued)

*Primary Examiner* — Yasser A Abdelaziez

(74) *Attorney, Agent, or Firm* — Jackson Walker L.L.P.

(57) ABSTRACT

A MEMS transducer package (300) comprises a package cover (313) comprising a first bonding region (316) and an integrated circuit die (319) comprising a second bonding region (314) for bonding with the first bonding region of the package cover. The integrated circuit die (309) comprises an integrated MEMS transducer (311) and integrated electronic circuitry (312) in electrical connection with the integrated MEMS transducer. The footprint of the integrated electronic circuitry (312) at least overlaps the bonding region (314) of the integrated circuit die (309).

15 Claims, 16 Drawing Sheets

304a
313b
313a
321
313
A
314
314
A
320
309a
309b
309
312
312
318
302
317
311
318
317
304

(51) Int. Cl.
*B81C 1/00* (2006.01)
*H04R 19/04* (2006.01)

(52) U.S. Cl.
CPC .... *H04R 19/005* (2013.01); *B81B 2201/0257* (2013.01); *B81B 2203/0315* (2013.01); *B81B 2207/012* (2013.01); *B81B 2207/015* (2013.01); *B81B 2207/07* (2013.01); *B81B 2207/096* (2013.01); *B81C 2203/0109* (2013.01); *H01L 2224/48137* (2013.01); *H01L 2924/15151* (2013.01); *H04R 19/04* (2013.01); *H04R 2201/003* (2013.01); *H04R 2499/11* (2013.01); *H04R 2499/15* (2013.01)

(58) Field of Classification Search
CPC .......... B81B 2207/015; B81B 2207/07; B81B 2207/096; B81C 1/00246; B81C 1/00309; B81C 2203/0109; H04R 19/005; H04R 19/04; H04R 2201/003; H01L 2224/48137; H01L 2924/15151
See application file for complete search history.

(56) References Cited

U.S. PATENT DOCUMENTS

2010/0181676 A1 7/2010 Montez et al.
2011/0073967 A1* 3/2011 Chen .................. B81C 1/00246 257/416
2011/0165717 A1 7/2011 Lee et al.
2013/0334621 A1* 12/2013 Classen ................ B81B 3/0018 257/415
2013/0334626 A1 12/2013 Weber
2015/0158718 A1* 6/2015 Reinmuth ............ B81C 1/0023 257/415
2015/0175406 A1* 6/2015 Lin ........................ B81B 7/007 257/415

FOREIGN PATENT DOCUMENTS

WO 2010125925 A1 11/2010
WO 2016102923 A1 6/2016
WO 2016102925 A1 6/2016

OTHER PUBLICATIONS

Combined Search and Examination Report, Application No. GB1605567.5, dated Oct. 14, 2016.
International Search Report and Written Opinion of the International Searching Authority, International Application No. PCT/GB2017/050183.

* cited by examiner

300

311
317

304a 313b
313a
313
321
A
A
314
314
320
309a
309b
309
312
312
318
302
317
311
317
318
304

MBW
314
314/316
Electronics
RDL – Re-Distribution Layer
Transducer
Bond Pad
Cap/Integrated Mic Interface Electronics Transducer Bond Pad Acoustic Seal Ring Metal Seal Ring – Light Shield

INTEGRATED MEMS TRANSDUCERS

This application claims priority to U.S. Provisional Application No. 62/288,699 filed on Jan. 29, 2016, and British Patent Application No. 1605567.5 filed on Apr. 1, 2016, both of which are incorporated by reference herein in their entirety.

This application relates to methods and apparatus relating to integrated MEMS transducers, and, in particular, to arrangements for providing an integrated MEMS transducer, such as a MEMS microphone, formed on an integrated circuit die.

BACKGROUND

Consumer electronics devices are continually getting smaller and, with advances in technology, are gaining ever-increasing performance and functionality. This is clearly evident in the technology used in consumer electronic products and especially, but not exclusively, portable products such as mobile phones, audio players, video players, PDAs, wearable devices, mobile computing platforms such as laptop computers or tablets and/or games devices, or devices operable in an Internet-of-Things (IoT) system or environment. Requirements of the mobile phone industry for example, are driving the components to become smaller with higher functionality and reduced cost. It is therefore desirable to integrate functions of electronic circuits together and combine them with transducer devices such as microphones and speakers.

Micro-electromechanical-system (MEMS) transducers, such as MEMS microphones are finding application in many of these devices. There is therefore also a continual drive to reduce the size and cost of MEMS devices.

Microphone devices formed using MEMS fabrication processes typically comprise one or more membranes with electrodes for read-out/drive deposited on the membranes and/or a substrate. In the case of MEMS pressure sensors and microphones, the read out is usually accomplished by measuring the capacitance between the electrodes.

To provide protection the MEMS transducer will typically be contained within a package. The package effectively encloses the MEMS transducer and can provide environmental protection and may also provide shielding for electromagnetic interference (EMI) or the like. For microphones and the like the package will typically have a sound port to allow transmission of sound waves to/from the transducer within the package and the transducer may be configured so that the flexible membrane is located between first and second volumes, i.e. spaces/cavities that may be filled with air (or some other fluid), and which are sized sufficiently so that the transducer provides the desired acoustic response. The sound port acoustically couples to a first volume on one side of the transducer membrane, which may sometimes be referred to as a front volume. The second volume, sometimes referred to as a back volume, on the other side of the one of more membranes is generally required to allow the membrane to move freely in response to incident sound or pressure waves, and this back volume may be substantially sealed (although it will be appreciated by one skilled in the art that for MEMS microphones and the like the first and second volumes may be connected by one or more flow paths, such as small holes in the membrane, that are configured so as present a relatively high acoustic impedance at the desired acoustic frequencies but which allow for low-frequency pressure equalisation between the two volumes to account for pressure differentials, for example due to temperature changes). It is noted that in some applications, such as bidirectional microphones, a sound port may also be acoustically coupled to the second volume, such that the membrane receives acoustic signal via both the front volume and the second volume.

FIG. 1*a* illustrates one conventional MEMS microphone package 100*a*. A MEMS transducer 101 is attached to a first surface of a package substrate 102. The MEMS transducer may typically be formed on a semiconductor die by known MEMS fabrication techniques. The package substrate 102 may be silicon or PCB or any other suitable material. A cover 103 is located over the transducer 101 attached to the first surface of the package substrate 102. The cover 103 may be a one piece structure, for example a metallic lid. An aperture 104, i.e. acoustic port, in the cover 103 provides the sound port and allows acoustic signals to enter the package. In this example the transducer 101 is wire bonded to the substrate 102 via terminal pads 105 on the package substrate 102 and transducer 101. As mentioned above, a sound port 104*a* may also be provided, for example in a bidirectional microphone, such that the membrane receives acoustic signals via both the front volume and the second volume.

FIG. 1*b* illustrates another known MEMS transducer package 100*b*. Again a transducer 101, which may be a MEMS microphone, is attached to the first surface of a package substrate 102. In this example the package also contains an integrated circuit 106. The integrated circuit 106 may be provided for operation with the transducer and may for example be a low-noise amplifier for amplifying the signal from a MEMS microphone. The integrated circuit 106 is electrically connected to electrodes of the transducer 101 and is also attached to the first surface of the package substrate 102. The integrated circuit 106 is bonded to the transducer 101 via wire-bonding. Alternatively, the integrated circuit 106 may be flip-chip bonded to the package substrate 102, or flip-chip mounted and wire bonded. A cover 107, for example a two-piece cap, is located on the package substrate so as to enclose the transducer 101 and the integrated circuit 106. In this package the cover 107 comprises an upper part or lid portion 107*a* and side walls 107*b* or a spacer region which are all formed, for example, from PCB. The cover 107 has a sound port 104 in the upper part 107*a* which allows acoustic signals to enter the package. As mentioned above, in a bidirectional microphone the package substrate 102 may also comprise a sound port 104*a* for allowing passage of acoustic signals to the transducer 101 from beneath the package substrate 102, i.e. for providing the bi-directional element.

FIG. 2*a* illustrates another MEMS transducer package 100*c*, for example a chip scale (CS) MEMS transducer package that is formed at wafer level, also known as a wafer level package (WLP). The MEMS transducer package 100*c* comprises a MEMS transducer device 109, which may be a MEMS microphone, bonded to a cap section 113. In this example the MEMS transducer device 109 comprises a substrate 110. Integrated electronic circuitry 112 is provided within the substrate 110, with a MEMS transducer 111, for example a flexible membrane, formed relative to a cavity in the substrate 110. The integrated electronic circuitry 112 may be provided for operation with the MEMS transducer 111 and may for example include a low-noise amplifier for amplifying the signal from a MEMS microphone. The integrated electronic circuitry 112 is electrically connected (not shown) to electrodes of the MEMS transducer 111, and is also electrically connected (not shown) to bonding structures 117 coupled to a first surface of the substrate 110. The substrate 110, MEMS transducer 111 and integrated electronic circuitry 112 effectively form a MEMS transducer device 109 comprised of an integrated circuit die, which may provide an analog or digital output.

This type of packaging arrangement may be referred to as a "bottom port" configuration, wherein the MEMS transducer package 110*c* is "flip-chip" bonded to the next level of interconnect when assembled in a host device, for example to a PCB within a consumer device.

In the package arrangement shown in FIG. 2*a* the bond arm length of the cap section 113 is illustrated as reference 114, with the bond arm length of the MEMS transducer device 109 (and in particular the substrate 110) illustrated as reference 115.

In the example of this type of bottom-port configuration there is no sound port within the cap section 113 itself. Instead, acoustic signals are channeled to the outer surface of the MEMS transducer 111 (i.e. the underside of the membrane in FIG. 2*a*) when the MEMS transducer package 100*c* is mounted during use, for example when mounted to a PCB or substrate within a consumer device. It is noted, however, that a bidirectional microphone may comprise a sound port 104*a* in the cap section 113 for allowing passage of acoustic signals to the transducer 111.

FIG. 2*b* shows a bottom-side view of the MEMS package 100*c*, illustrating how the integrated electronic circuitry 112 is formed to one side of the MEMS transducer 111, with a plurality of bonding structures 117 provided for electrical connection to another device, e.g. the consumer product in which the MEMS package 100*c* is assembled during use.

FIG. 2*c* shows a cross-section at an interface where the MEMS transducer device 109 and cap section 113 meet. As can be seen, in order to create a bottom port chip scale wafer level package for a MEMS capacitive microphone it is necessary to have a minimum width of substrate, e.g. silicon, around the complete interface between the substrate and the cap. The interface is where the substrate 110 and the cap 113 are "bonded" to one another, for example using an adhesive. Therefore, there is a minimum bond width (MBW) that is required if mechanical stability is to be achieved. The MBW, and hence mechanical stability, can depend on factors such as the height of the substrate and/or cap bond arms 115/114: the longer each or both arm the greater the MBW should be and vice-versa.

The dotted rectangle in FIG. 2*b* illustrates what the die size of a MEMS transducer substrate would typically be for a traditionally wire bonded MEMS microphone. The area outside this dotted rectangle (corresponding to the shaded area in FIG. 2*c*) therefore illustrates the additional silicon area that is required for bonding the MEMS transducer device 109 and cap section 113 together, i.e. the minimum bond width (MBW) area.

Therefore, because of the minimum bond width (MBW), the area of both the MEMS transducer device 109 and the cap section 113 needs to be greater than it would normally be in the case where a silicon substrate is traditionally wire bonded to a support substrate of a package. The net result is that, for both the substrate and cap wafers, the maximum number of die per wafer will be limited because of the extra area required for the MBW. Furthermore, the increased size of the MEMS transducer package 100*c* has the disadvantage of requiring more space in a host assembly, for example a greater footprint.

SUMMARY

It is an aim of the present invention to provide a method and apparatus which obviate or reduce at least one or more of the disadvantages mentioned above.

According to a first aspect of the present invention there is provided a MEMS transducer package comprising a package cover, and an integrated circuit die comprising a bonding region for bonding with the package cover. The integrated circuit die comprises an integrated MEMS transducer and integrated electronic circuitry in electrical connection with the integrated MEMS transducer. A footprint of the integrated electronic circuitry at least overlaps with the bonding region of the integrated circuit die.

According to another aspect of the present invention there is provided a MEMS transducer package comprising a package cover, and an integrated circuit die comprising a bonding region for bonding with the package cover. The integrated circuit die comprises an integrated MEMS transducer and integrated electronic circuitry in electrical connection with the integrated MEMS transducer. At least one plane through the integrated circuit die passes through the integrated electronic circuitry and the bonding region of the integrated circuit die.

According to another aspect, there is provided a MEMS transducer package comprising a package cover, and an integrated circuit die comprising an integrated MEMS transducer. The package cover comprises integrated electronic circuitry.

BRIEF DESCRIPTION OF THE DRAWINGS

For a better understanding of examples of the present invention, and to show more clearly how the examples may be carried into effect, reference will now be made, by way of example only, to the following drawings in which.

DESCRIPTION

Embodiments of the present invention relate to a MEMS transducer device, for example a MEMS microphone. In some examples the MEMS transducer device forms part of a MEMS transducer package, and may relate to a chip scale (CS) MEMS capacitive microphone package that is formed at wafer-level. In some examples the wafer level package (WLP) comprises a substrate, for example a silicon substrate, which incorporates both the MEMS capacitive microphone and its associated integrated electronic circuitry, for example electronic circuitry for providing drive & read-out circuitry; and a package cover or cap, for example a silicon cap, for protecting the silicon substrate and providing a back-volume for the microphone.

Some of the embodiments will be described below in the form of a wafer level package that is configured as a "bottom port" package, wherein the package is "flip-chip" bonded to the next level of interconnect, e.g. bonded to another substrate or PCB within a host assembly, such as a consumer product. It is noted, however, that the invention may also be used in other packaging arrangements, or in other mounting configurations.

It is noted that any dimensions in the Figures of the embodiments described below are conceptual, and not necessarily to scale.

Figure 3A:
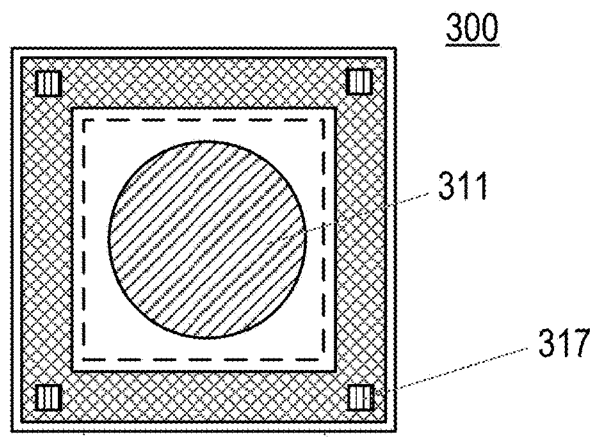
FIGS. 3*a*, 3*b* and 3*c* illustrate an example of a MEMS transducer package according to an embodiment of the present invention.
Figure 3B:
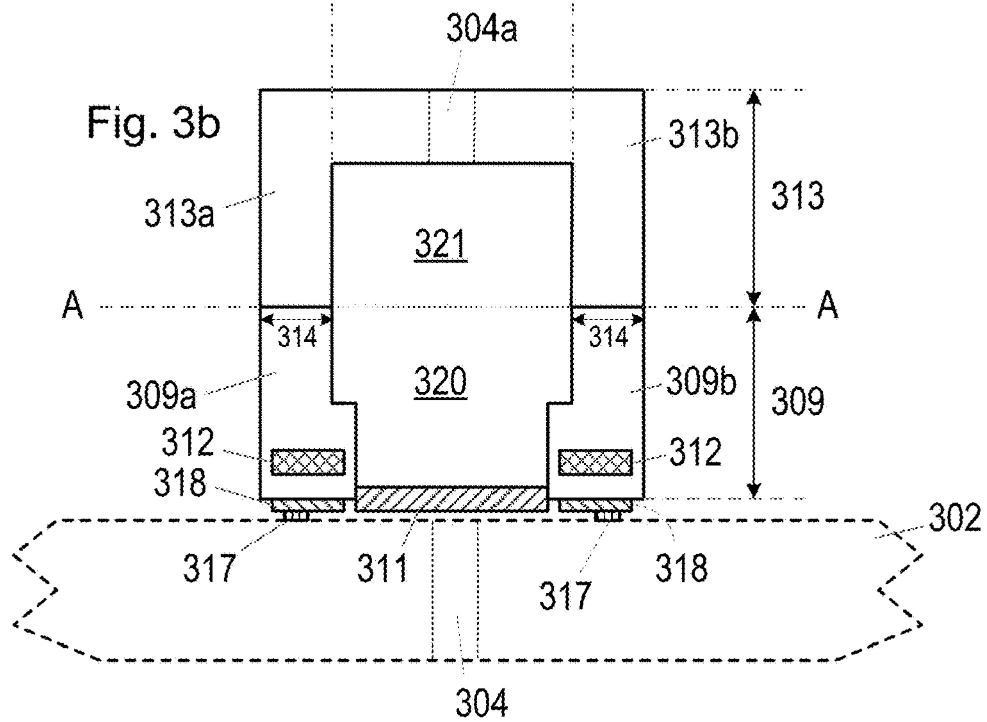
Figure 3C:
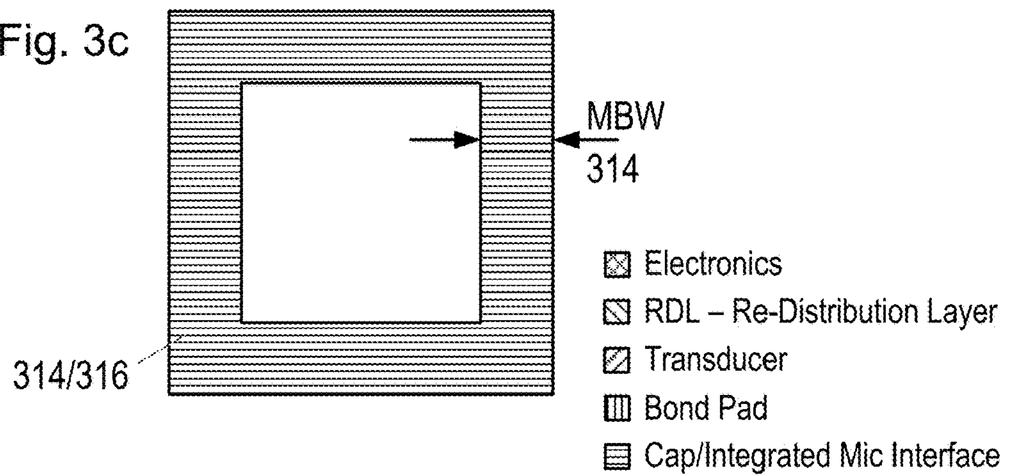

FIGS. 3*a* to 3*c* show an example of a MEMS transducer package 300 according to an embodiment. FIG. 3*a* relates to a bottom-side view of the MEMS transducer package 300. FIG. 3*b* relates to a cross-sectional side view illustrating how the MEMS transducer package 300 may be mounted when assembled in a host device, for example in a bottom-port arrangement to a substrate 302 of a host device (the substrate 302 comprising a sound port 304 for allowing passage of acoustic signals to the integrated MEMS transducer 311). FIG. 3*c* relates to a cross-sectional view at an interface A-A of FIG. 3*b*.

Referring to FIG. 3*b*, the MEMS transducer package 300 comprises a package cover 313. The MEMS transducer package 300 also comprises an integrated circuit die 309 (for example forming a MEMS transducer device), the integrated circuit die comprising a bonding region 314 for bonding with the package cover 313.

The integrated circuit die 309 comprises an integrated MEMS transducer 311 and integrated electronic circuitry 312 in electrical connection with the integrated MEMS transducer 311. A footprint of the integrated electronic circuitry 312 at least overlaps with the bonding region 314 of the integrated circuit die 309. For example, the integrated electronic circuitry 312 may be formed within the integrated circuit die such that the integrated electronic circuitry is formed in an area underneath a bond arm (309*a*, 309*b*), or within an area under a section of the bonding region 314 of the integrated circuit die, such that the integrated electronic circuitry 312 overlaps with this area, and wherein the bonding region 314 is used for bonding the integrated circuit die to another substrate, such as the package cover 313. It can be seen that the footprint of the integrated electronic circuitry 312 overlaps at least partially with the footprint of the bonding region 314 (albeit in different planes).

It is noted that although the example of FIG. 3*b* shows an integrated circuit die 309 in which the bonding region 314 of the integrated circuit die is substantially symmetrical on all sides (as illustrated in FIGS. 3*a* and 3*c*), it is noted that different sides may have bonding regions of different size or width or area. Indeed, in some embodiments the bonding region 314 may have different shaped portions on one or more sides of the MEMS transducer 311. For example, the bonding region may be polygon shaped, hexagonal shaped, circular shaped, rectangular shaped or curved, rather than square as shown. The size and/or shape of a particular bonding region 314 may be designed, for example, based on minimum bond width (MBW) criteria for a particular application, or based on the extra space required to accommodate the integrated electronic circuitry 312 of a particular application.

Figure 1A:
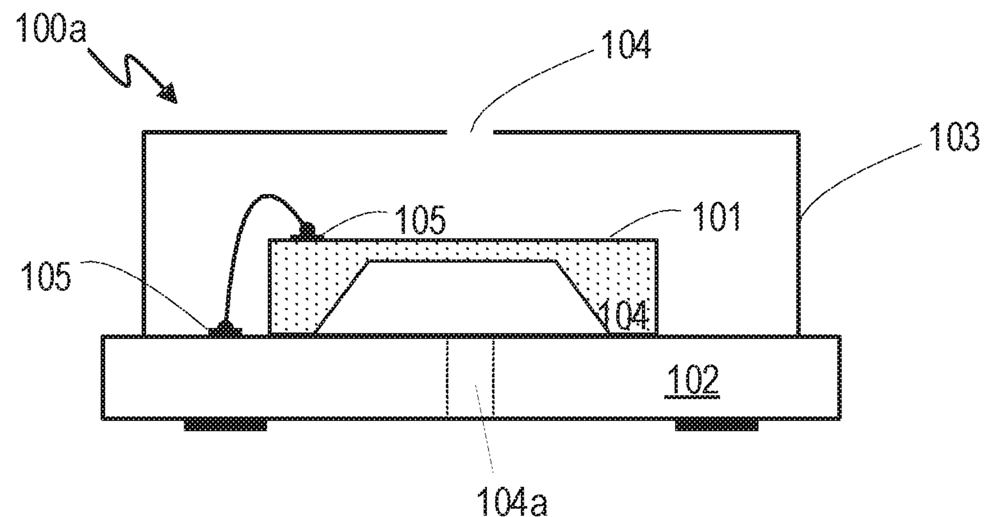
FIGS. 1*a* and 1*b* illustrate prior art MEMS transducer packages.
Figure 1B:
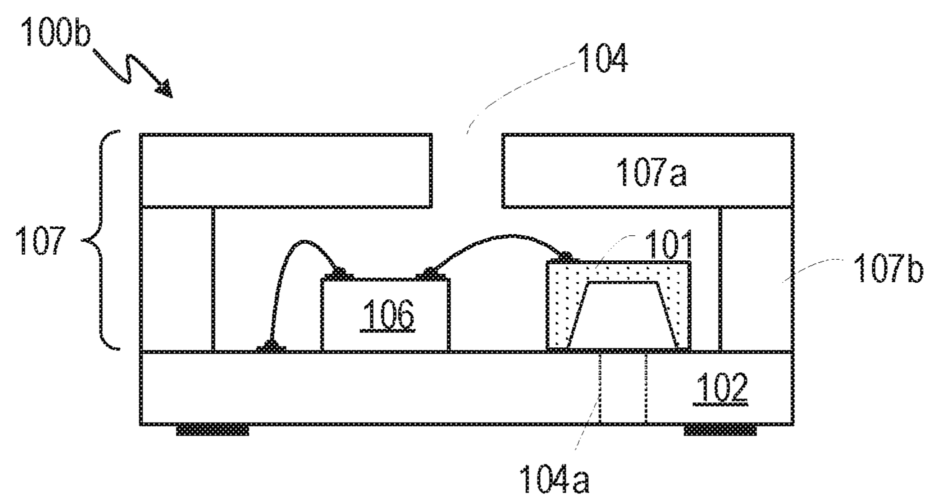
Figures 2A, 2B, 2C:
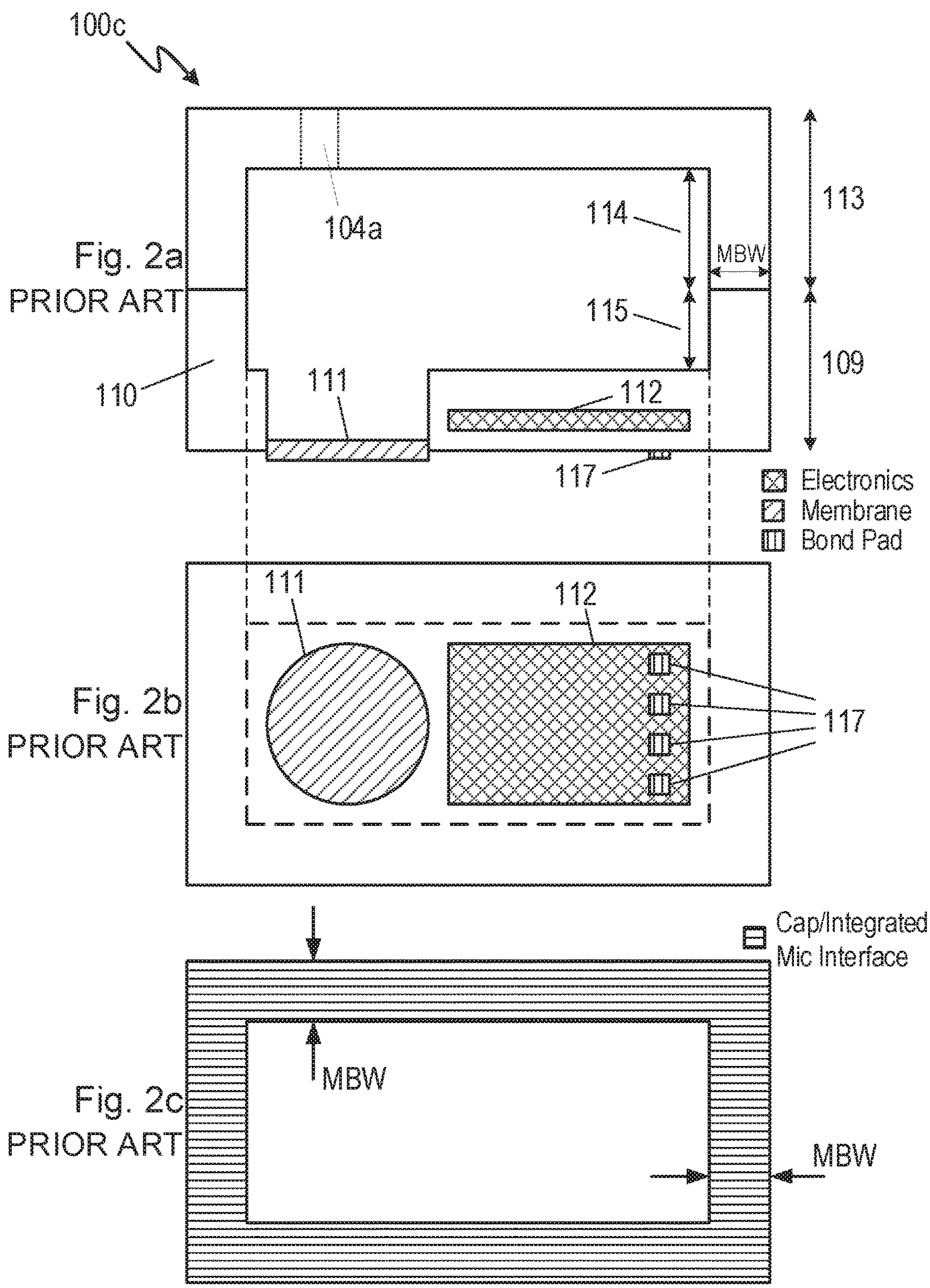
FIGS. 2*a*, 2*b* and 2*c* illustrate another prior art MEMS transducer package.

By forming the footprint of the integrated electronic circuitry 312 such that it at least overlaps the bonding region 314 of the integrated circuit die 309, this enables the overall size of the MEMS transducer package 300 to be reduced, especially when a comparatively large bonding region or surface is needed for bonding the integrated circuit die 309 and package cover 313. For example, FIG. 3*c* illustrates that the minimum MBW area required by both the integrated circuit die 309 and package cover 313 is less than that required in FIG. 2*c*.

As mentioned above, the integrated circuit die 309 may comprise bonding arms, for example bonding arms 309*a* and 309*b* as shown in the cross-section of FIG. 3*b*, for bonding with the package cover 313 at the bonding region 314. The bonding arms 309*a*, 309*b* define at least part of a first cavity 320 in the integrated circuit die 309.

It is noted that in the example of FIG. 3*b* a bonding arm may be provided on each side of the integrated circuit die 309 (with only the bonding arms 309*a/b* being illustrated in the cross-sectional view), the bonding arms together forming the first cavity 320. It will be appreciated that a different shaped device, for example a polygon shaped device could comprise a different number of bonding arms 309. In another example a circular device could effectively comprise a unitary bonding arm, for example a cylindrically shaped bonding arm 309 or section in the integrated circuit die 309.

In addition to providing a mechanical coupling, the bond arms 309*a/b* may also provide an electrical connection between the integrated circuit die 309 and the package cover 313, for example if the package cover comprises a metal shielding element, or if the package cover comprises integrated electronic circuitry as described later in the application.

The package cover 313 may also comprise bonding arms 313*a*, 313*b* for bonding with the integrated circuit die 309, the bonding arms 313*a*, 313*b* defining at least part of a second cavity 321 in the package cover 313.

As above, it is noted that in the example of FIG. 3*b* a bonding arm may be provided on each side of the package cover 313, with only the bonding arms 313*a/b* being illustrated in the cross-sectional view, the bonding arms together forming the second cavity 321. As above, it will be appreciated that a different shaped device, for example a polygon shaped device, may comprise a different number of bonding arms. A circular shaped package cover may comprise a unitary bonding arm, for example a cylindrically shaped bonding arm or section within the package cover.

According to some examples, the footprint of the integrated electronic circuitry 312 is formed around at least two sides of the MEMS transducer 111.

In some examples, the footprint of the integrated electronic circuitry 312 overlaps with at least part of the first cavity 320 of the integrated circuit die 309. For example, in an embodiment having a stepped first cavity 320 as shown in FIG. 3*b*, the electronic circuitry 312 is shown as extending "inwards" towards the cavity, such that it overlaps with a part of the first cavity 320 (i.e. overlaps with a second portion of the first cavity 320 which has a larger cross-sectional area compared to a first portion of the first cavity 320, the first portion being the portion which interfaces with the integrated MEMS transducer 311, and the second portion of the first cavity 320 being the portion that interfaces with a surface of the integrated circuit die that bonds with the package cover).

In the embodiment of FIG. 3*b*, the first cavity 320 therefore comprises a first portion and a second portion, wherein the cross-sectional area of the first portion of the first cavity 320 which interfaces with the integrated MEMS transducer 311 is smaller than the cross-sectional area of the second portion of the first cavity 320 at a surface of the integrated circuit die that interfaces with the package cover 313.

It is noted that in other examples the footprint of the integrated electronic circuitry 312 may be formed such that it falls entirely under the bonding region 314 of the integrated circuit die 309, or within a bonding arm 309*a/b* of the integrated circuit die 309.

The first cavity 320 in the integrated circuit die 309 may be formed in any known way, for example using CMOS processing techniques. Advantageously the cavity may have a cross sectional area that increases towards the upper side, i.e. other side, of the substrate forming the integrated circuit die 309, forming the first and second portions mentioned above. Thus the cavity immediately above the transducer 311 may have a first cross sectional area so that the area of the membrane is defined accurately. Towards the upper side of the substrate forming the integrated circuit die 309 the cross sectional area of the cavity 320 may be larger so as to maximise the part of the back volume provided by the cavity 320. In some embodiments there may be a step change in the slope profile of the walls of the cavity 320. Such a cavity profile may be achieved by a multi-stage etching process such as described in the patent GB2451909.

In some embodiments the MEMS transducer package may comprise an electrical redistribution layer 318 coupled to the first surface of the integrated circuit die 309. The electrical redistribution layer 318 provides an electrical connection between one area of the integrated circuit die 309 and another area of the integrated circuit die, for example to connect electrical signals to a bonding structure 317 which is located at a particular location of the integrated circuit die. Therefore, the electrical redistribution layer may comprise, for example, a metal layer that makes input/output pads of the integrated circuit die 309 available in other locations.

The footprint of the integrated electronic circuitry 312 may overlap with at least part the electrical redistribution layer 318.

In some embodiments the footprint of the integrated electronic circuitry 312 is formed around at least part of all sides of the integrated MEMS transducer 311. For example, the footprint of the integrated electronic circuitry 312 may be formed substantially evenly around all sides of the integrated MEMS transducer 311.

In the example of FIG. 3*b*, the package cover 313 comprises a second cavity 321. In such an embodiment there is a back volume defined by the first cavity 320 of the integrated circuit die 309 and the second cavity 321 of the package cover 313.

It is noted, however, that the package cover need not necessarily comprise a cavity 321, for example the package cover 313 may instead comprise a planar cover, e.g. a planar substrate. In such an embodiment there would be a back volume defined by just the first cavity 320 of the integrated circuit die 309. The present invention would still provide the advantage of arranging the footprint of the integrated electronic circuitry 312 of the integrated circuit die 309 such that it overlaps with the bonding region 314 of the integrated circuit die, thereby still enabling the overall size of the device to be reduced.

It is noted that in a MEMS transducer package 300 relating to a bidirectional microphone, the package cover 313 may comprise a sound port 304*a* for allowing passage of acoustic signals to the integrated MEMS transducer 311 via the package cover 313, in addition to acoustic signals received via a sound port 304 of a substrate 302 to which the MEMS transducer package 300 is coupled when assembled in a host device.

From FIG. 3*b* it can be seen that, in some embodiments, at least part of the outer surface of the MEMS transducer package is formed by the integrated circuit die 309.

The integrated circuit die 309 may further comprise one or more bonding structures 317, as illustrated in FIGS. 3*a* and 3*b*. The one or more bonding structures 317 may be provided on an outer surface of the integrated circuit die 309, and electrically coupled (not shown) to the integrated electronic circuitry 312.

In the embodiments described herein, it is noted that the integrated electronic circuitry 312 may comprise analogue circuitry and/or digital circuitry.

According to one embodiment the integrated MEMS transducer 311 is formed at a first surface of the integrated circuit die 309. The integrated circuit die 309 comprises a cavity 320 wherein said integrated MEMS transducer 311 at least partly overlaps with the cavity, whereby the cavity 320 extends through the first integrated circuit die from the integrated MEMS transducer 311 to an opening at a second surface of the integrated circuit die 309.

Such an embodiment may further comprise a cavity 321 formed in the package cover 313 at a surface of the package cover which abuts the second surface of the integrated circuit die 309, to provide a back volume defined by the cavity 320 in the integrated circuit die and cavity 321 in the package cover. The cross-sectional area of the cavity 320 at the integrated MEMS transducer 311 is smaller than at the cross-sectional area at the second surface of the integrated circuit die. In some embodiments, the cavity 320 may extend underneath the integrated electronic circuitry.

Figure 4A:
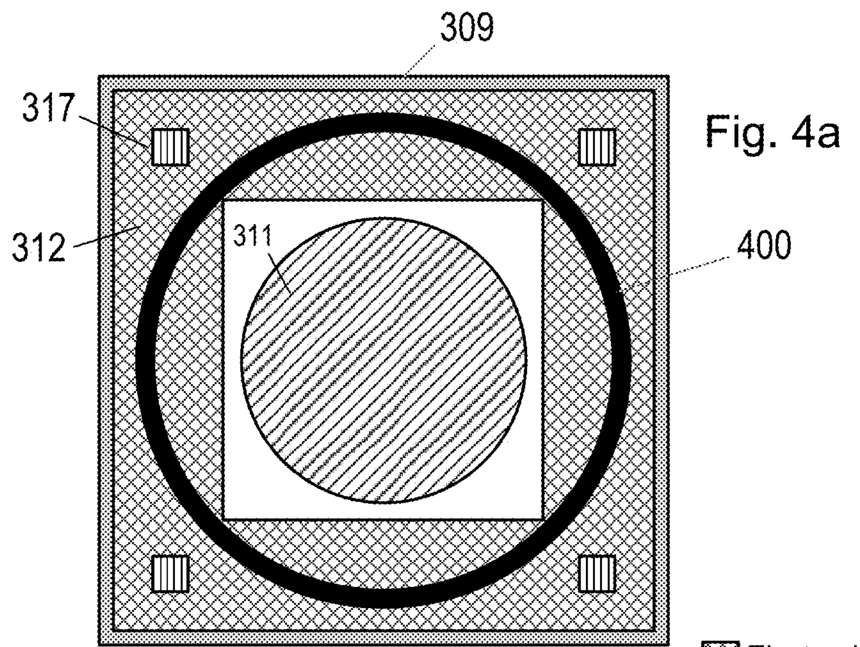
FIG. 4*a* shows an example of a MEMS transducer package according to another embodiment of the present invention.

Referring to FIG. 4*a*, according to some embodiments the integrated circuit die 309 may further comprise a sealing element 400 on an outer surface of the integrated circuit die (e.g. the "first" surface mentioned above), the sealing element 400 surrounding the integrated MEMS transducer 311. In one example the sealing element 400 comprises an acoustic sealing element, such as an acoustic sealing ring. It is noted that other shaped sealing elements 400 may also be provided, for example polygon shaped or square shaped or any other shape, including irregular shapes. The sealing element 400 may be provided for acoustically sealing the integrated MEMS transducer 311, for example such that the MEMS transducer 311 only receives desired acoustic signals being channeled to the MEMS transducer 311 in a bottom-port configuration when mounted during use in a host assembly, e.g. via a sound port 304 as shown in FIG. 3*b*.

That is, if the MEMS transducer package 300 is flip chip bonded onto a mother board 302 or similar, a sound port 304 or hole in the motherboard would be provided which would substantially line up with the MEMS transducer 311. The sealing element 400, which may be a metalized ring, i.e. a metalized annular bond pad, may be provided to aid in forming an acoustic channel in an assembled host device. It is noted that the acoustic sealing element 400 is not necessarily hermetically sealed, and may comprise one or more perforations or openings, provided the sealing element still has the effect of reducing or preventing unwanted acoustic signals from reaching the integrated MEMS transducer 300.

In one embodiment the footprint of the integrated electronic circuitry 312 is configured to at least partially overlap with the footprint of the sealing element 400, for example acoustic sealing element.

Figure 4B:
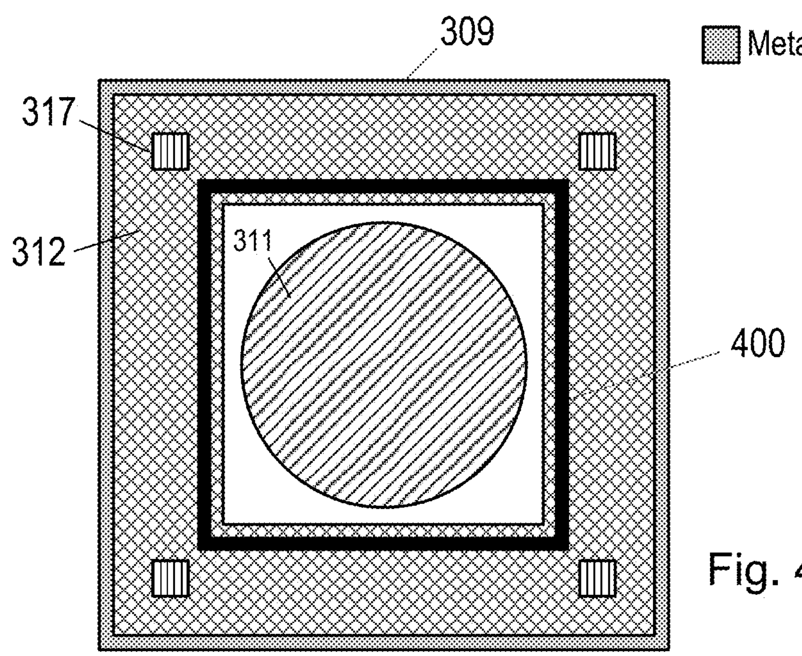
FIG. 4*b* shows an example of a MEMS transducer package according to another embodiment of the present invention.

Referring to FIG. 4*b*, this shows an example where the sealing element 400 is square shaped.

Figure 5:
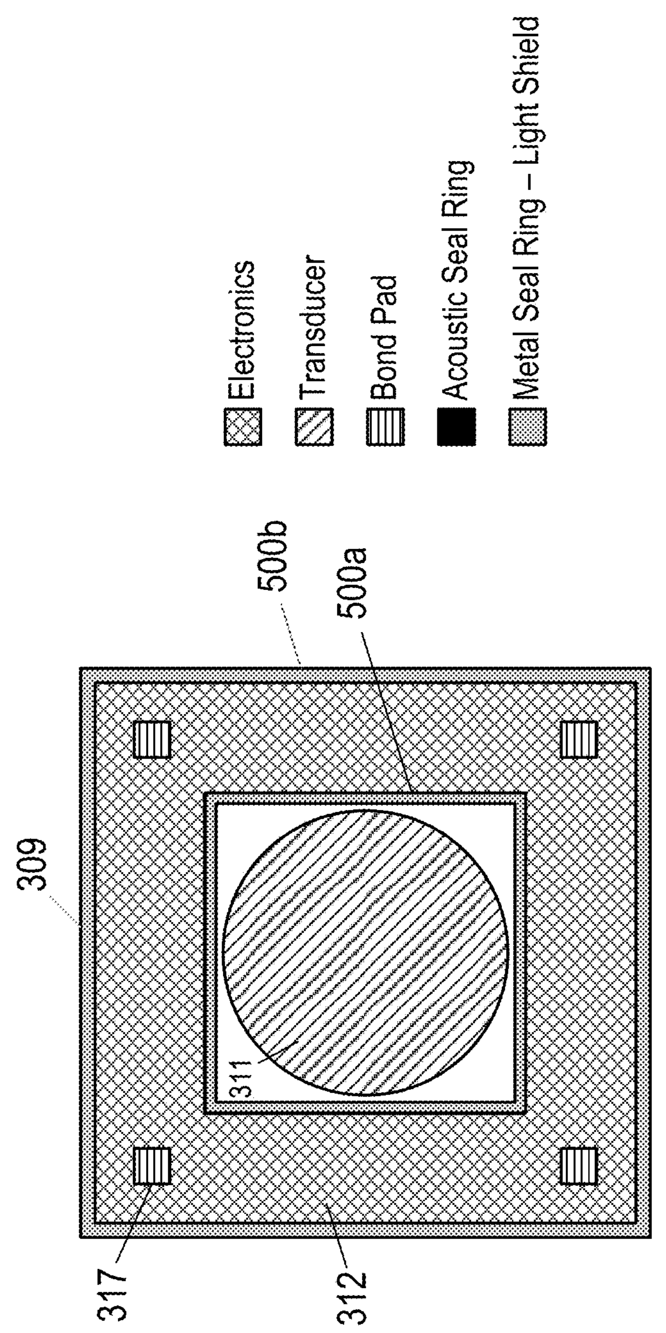
FIG. 5 shows an example of a MEMS transducer package according to another embodiment of the present invention.

Referring to FIG. 5, according to some embodiments the integrated circuit die 309 may further comprise an optical sealing element 500 for protecting the integrated electronic circuitry 312 from optical interference. For example, the optical sealing element 500, (e.g. made from a material which does not allow light to pass through, e.g. metal or non-metal) may comprise a first portion 500*a* provided around the inner periphery of the integrated electronic circuitry 312 and a second portion 500*b* provided around the outer periphery of the electronic circuitry 312. In some examples the optical sealing element is provided around the outer periphery only. The optical sealing element 500 may be formed from any shape, for example depending on the footprint of the integrated electronic circuitry which is being protected from light ingress interference.

It is noted that in some embodiments a MEMS transducer package may comprise an acoustic sealing element 400 as shown in FIG. 4*a* or 4*b* and an optical sealing element as shown in FIG. 5.

Figure 6A:
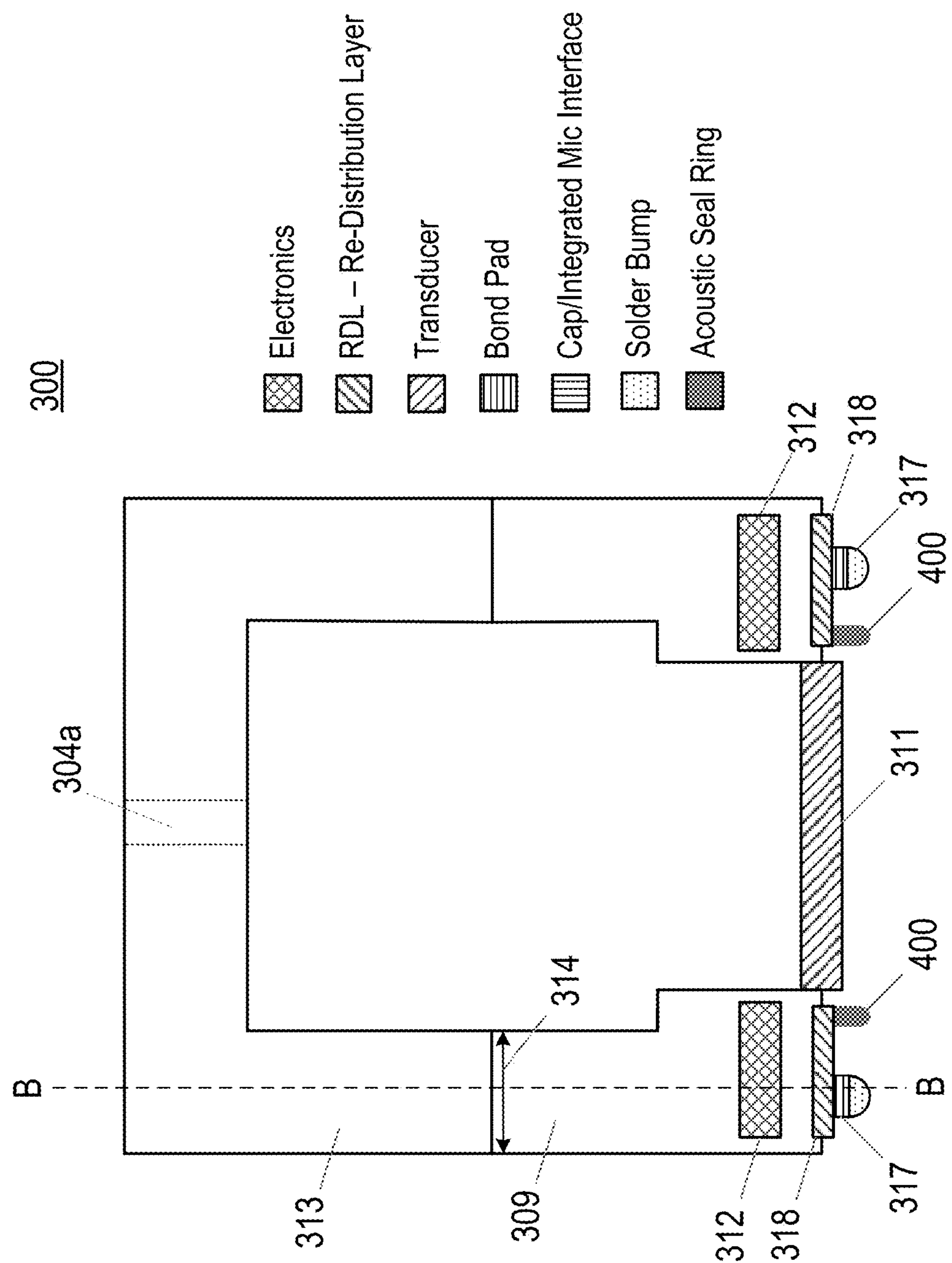
FIG. 6*a* shows an example of a MEMS transducer package according to another embodiment of the present invention.

Referring to FIG. 6*a*, according to another embodiment there is provided a MEMS transducer package 300 comprising a package cover 313, and an integrated circuit die 309 comprising a bonding region 314 for bonding with the package cover 313. The integrated circuit die 309 comprises an integrated MEMS transducer 311 and integrated electronic circuitry 312 for operation of the integrated MEMS transducer 311. At least one plane B-B through the integrated circuit die 309 passes through the integrated electronic circuitry 312 and the bonding region 314 of the integrated circuit die. In the example of FIG. 6*a* the plane B-B extends substantially orthogonal to a surface of the bonding region 314.

The integrated circuit die may further comprise an electrical redistribution layer 318, wherein at least one plane B-B through the integrated circuit die passes through the integrated electronic circuitry 312, the bonding region 314 and the electrical redistribution layer 318 of the integrated circuit die 309. As mentioned above, the electrical redistribution layer may comprise, for example, a metal layer that makes input/output pads (e.g. bonding structures 317) of the integrated circuit die 309 available in other locations.

In another embodiment in which the integrated circuit die further comprises a bonding structure 317, at least one plane B-B through the integrated circuit die passes through the integrated electronic circuitry 312, the bonding region 314, the electrical redistribution layer 318 and a bonding structure 317 of the integrated circuit die 309. Therefore, in such an embodiment the bonding structures 317 that are required for interconnection to the next interconnect layer can be redistributed (interconnect redistribution) in order to reduce the die size of the chip scale wafer level package. Such interconnect redistribution can take advantage of the layers for processing the MEMS microphone.

FIG. 6*a* also shows a sealing element 400, for example an acoustic sealing ring, provided on an outer surface of the integrated circuit die 309, as described above in FIGS. 4*a* and 4*b*, whereby the acoustic sealing element or acoustic sealing ring 400 surrounds the MEMS transducer. As mentioned above, the acoustic sealing element 400 may be provided for acoustically sealing the MEMS transducer 311, for example such that it only receives desired acoustic signals being channeled to the MEMS transducer 311 in a bottom-port configuration, i.e. from the underside when mounted during use.

In some examples, the footprint of the integrated electronic circuitry 312 may be arranged to overlap with a footprint of the sealing element 400, for example an acoustic sealing element.

Figure 6B:
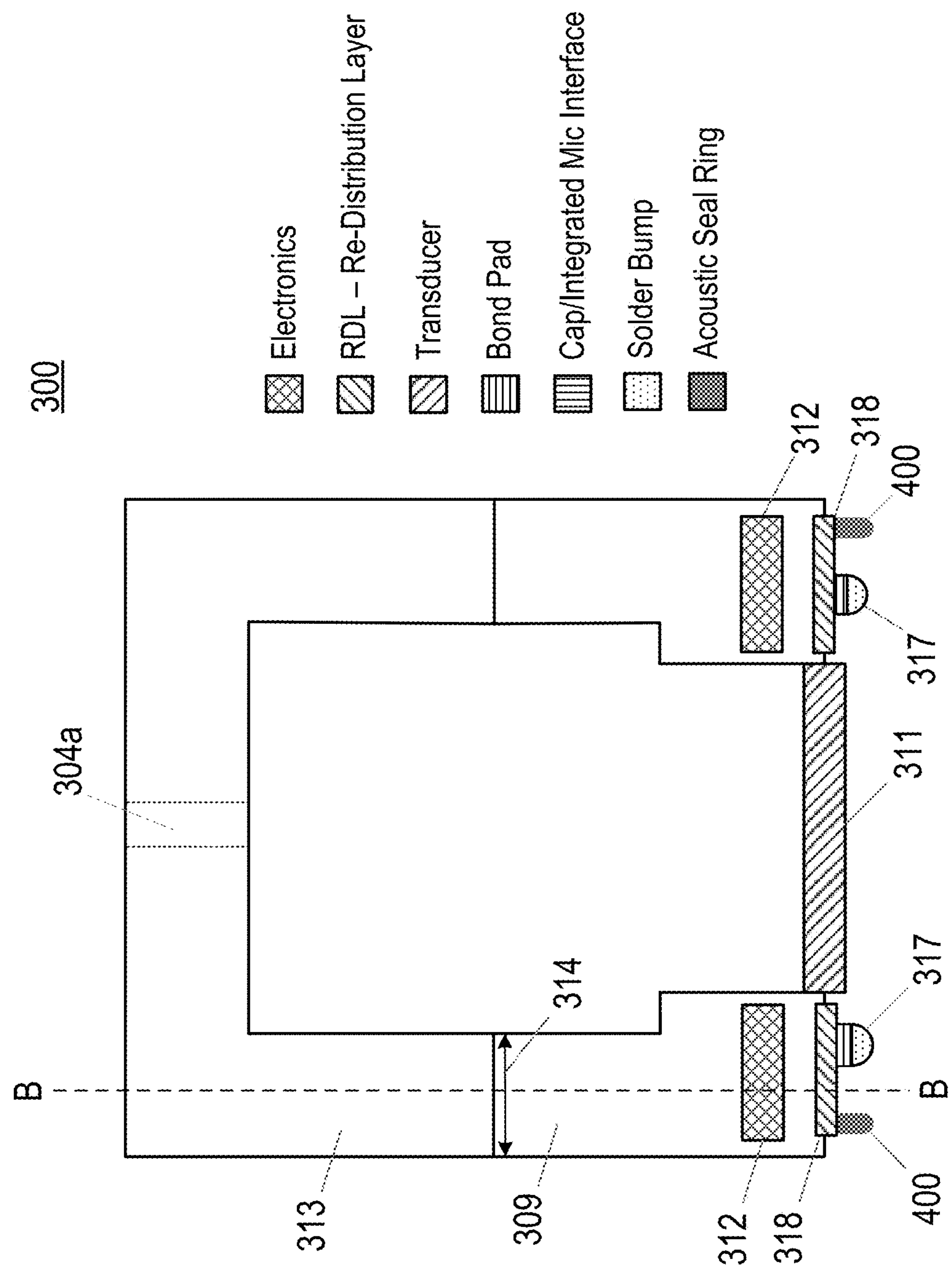
FIG. 6*b* shows an example of a MEMS transducer package according to another embodiment of the present invention.

FIG. 6*b* shows an example similar to FIG. 6*a*, but where the sealing element 400 is positioned on an outer side of the bonding structures 317, relative to the integrated MEMS transducer 311. According to one embodiment, at least one plane B-B through the integrated circuit die passes through the integrated electronic circuitry 312, the bonding region 314 and the sealing element 400. In another embodiment, at least one plane B-B through the integrated circuit die passes through the integrated electronic circuitry 312, the bonding region 314, the sealing element 400 and the electrical redistribution layer 318 of the integrated circuit die 309.

Although the embodiments described herein illustrate an integrated MEMS transducer 311 having a single membrane, it is noted that in some embodiments the integrated MEMS transducer 311 comprises multiple individual MEMS transducers on the integrated circuit die 309, for example comprising separate membranes. In such an example the integrated electronic circuitry can be distributed around the plurality of MEMS transducers. In some examples at least one of said multiple individual MEMS transducers is a different type of transducer to at least one other of said multiple individual MEMS transducers.

According to one embodiment there is provided an electronic device comprising a MEMS transducer package as described in the embodiments herein. The electronic device may comprise, for example, at least one of: a portable device; a battery power device; a computing device; a wearable device, a device operable in an Internet-of-Things environment, a communications device; a gaming device; a mobile telephone; a personal media player; a laptop, tablet or notebook computing device.

As mentioned earlier, it is noted that the integrated MEMS transducer 311 is not necessarily circular. For example, the integrated MEMS transducer 311 may comprise membranes of other shapes, or a membrane mounted via stress distribution arms, for example to provide stress decoupling.

Figure 7:
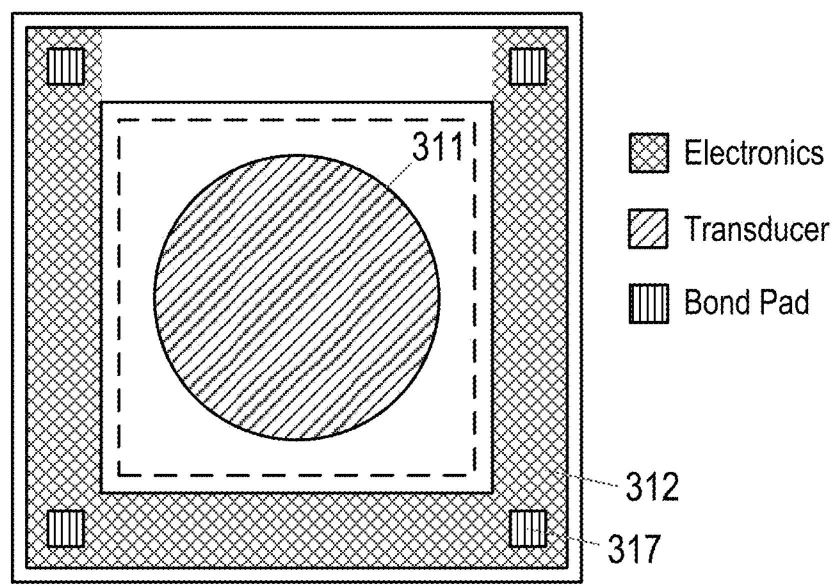
FIG. 7 shows an example of a MEMS transducer package according to another embodiment of the present invention.

Referring to FIG. 7, this example shows that the integrated electronic circuitry 312 need not be on all four sides of the MEMS transducer 311. For example, the embodiment of FIG. 7 shows the integrated electronic circuitry 312 distributed around three sides of the MEMS transducer.

Figure 8:
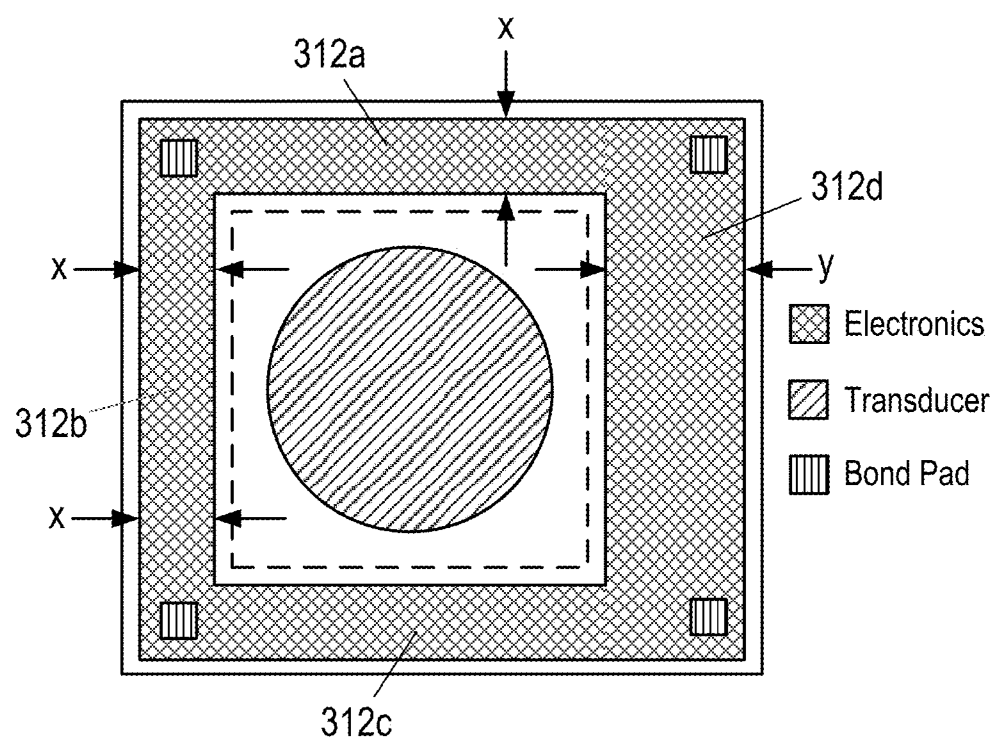
FIG. 8 shows an example of a MEMS transducer package according to another embodiment of the present invention.

Furthermore, referring to FIG. 8, this example shows that the distribution of the integrated electronic circuitry 312 need not be symmetrical. For example, the embodiment of FIG. 8 shows that the footprint of the integrated electronic circuitry 312 has a greater area or width "Y" on one side of the MEMS transducer 311, e.g. side 312*d* of the footprint of the integrated electronic circuitry, compared to the area or width "X" one or more other sides, e.g. sides 312*a*, 312*b* or 312*c* of the footprint of the integrated electronic circuitry, so as to accommodate the required amount of circuitry.

Figure 9:
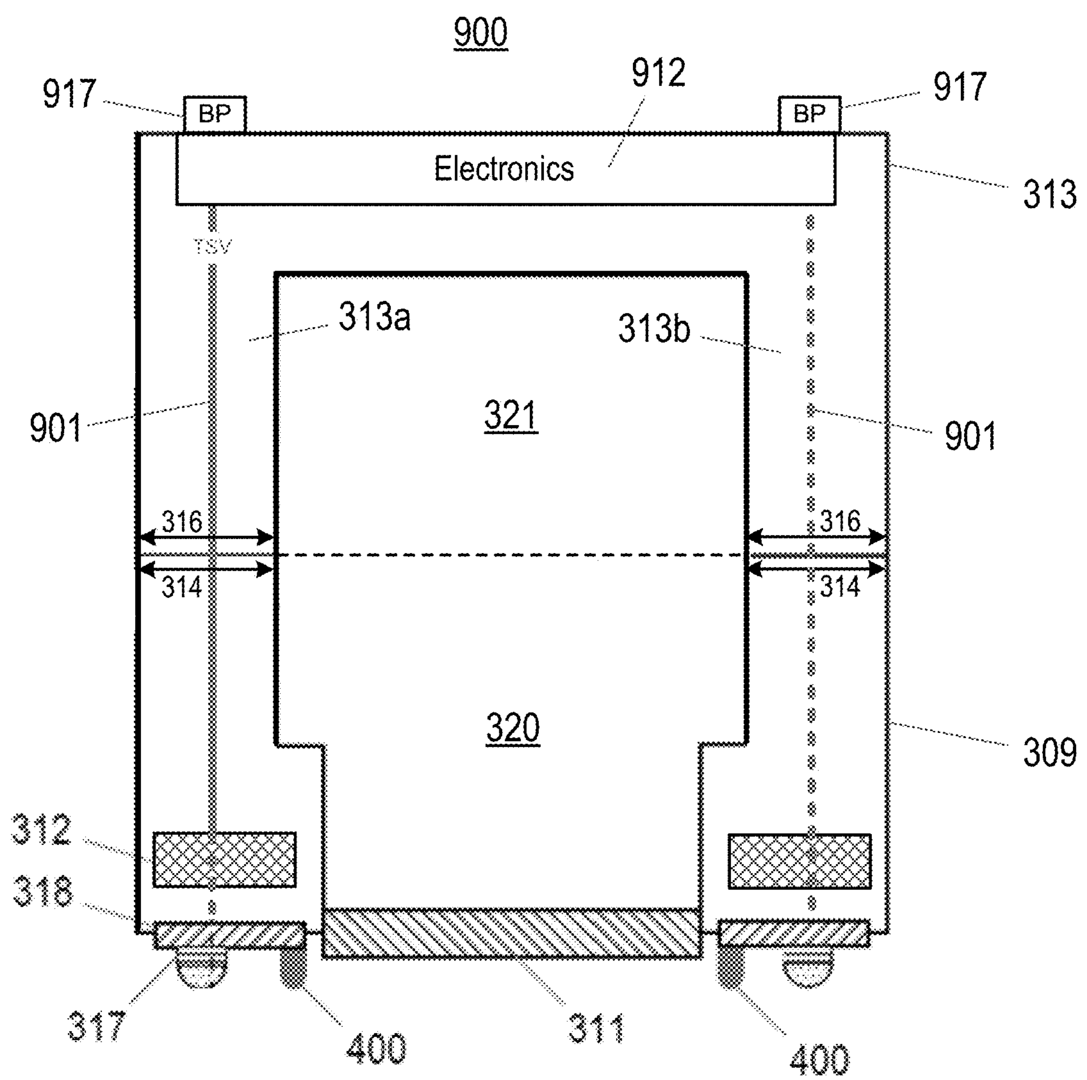
FIG. 9 shows an example of a MEMS transducer package according to another embodiment of the present invention.

FIG. 9 shows a MEMS transducer package 900 according to another embodiment. In the embodiment of FIG. 9 the package cover 313 comprises integrated electronic circuitry 912. It is noted that the embodiment of FIG. 9 can be combined with any one or more of the features described above in relation to FIGS. 3 to 8.

In the example of FIG. 9 the footprint of the integrated electronic circuitry 912 in the package cover 313 at least overlaps with the bonding region 314 of the integrated circuit die 309.

The package cover 313 may comprise one or more bonding arms 313*a*, 313*b* for bonding with the integrated circuit die 309, the one or more bonding arms defining at least part of a cavity 321 in the package cover 313. The one or more bonding arms 313*a/b* define a bonding region 316 of the package cover 313, for bonding the package cover 313 with the integrated circuit die 309.

In the example of FIG. 9 a footprint of the integrated electronic circuitry 912 in the package cover 313 at least overlaps with the bonding region 316 of the package cover 313.

The MEMS transducer package may further comprise one or more electrical connections 901 for connecting the integrated electronic circuitry 912 of the package cover 313 with the integrated electronic circuitry 312 of the integrated circuit die 309.

Thus, in some examples, the integrated circuit die 309 further comprises integrated electronic circuitry 312, and wherein the integrated electronic circuitry 912 of the package cover 313 is electrically connected to the integrated electronic circuitry 312 of the integrated circuit die 309.

The one or more electrical connections may also be provided for electrically connecting the integrated electronic circuitry 912 of the package cover with one or more bonding structures 317 coupled to the integrated circuit die 309, either in addition to an electrical connection with integrated electronic circuitry 312 in the integrated circuit die 309, or separately (for example in an embodiment where the integrated circuit die 309 does not comprise integrated electronic circuitry 312 itself).

In some examples the package cover 313 further comprises one or more bonding structures 917. It is noted that the bonding structures 917 coupled to the package cover 313 may either be provided in addition to any bonding structures 317 provided on the integrated circuit die 309, or in place of (for example where the integrated circuit die 309 itself does not comprise any integrated electronic circuitry).

Therefore, the MEMS transducer may comprise one or more electrical connections 901 to connect the integrated electronic circuitry 912 of the package cover 313 with one or more bonding structures 917 coupled to the package cover 313, and/or one or bonding structures 317 coupled to the integrated circuit die 309.

Thus, in some embodiments the integrated circuit die 309 and/or the package cover 313 may comprise one or more bonding structures 317, 917, wherein the integrated electronic circuitry 912 of the package cover 313 is electrically connected to one or more of the bonding structures 317, 917 of the package cover 313 and/or integrated circuit die 309.

Figure 10:
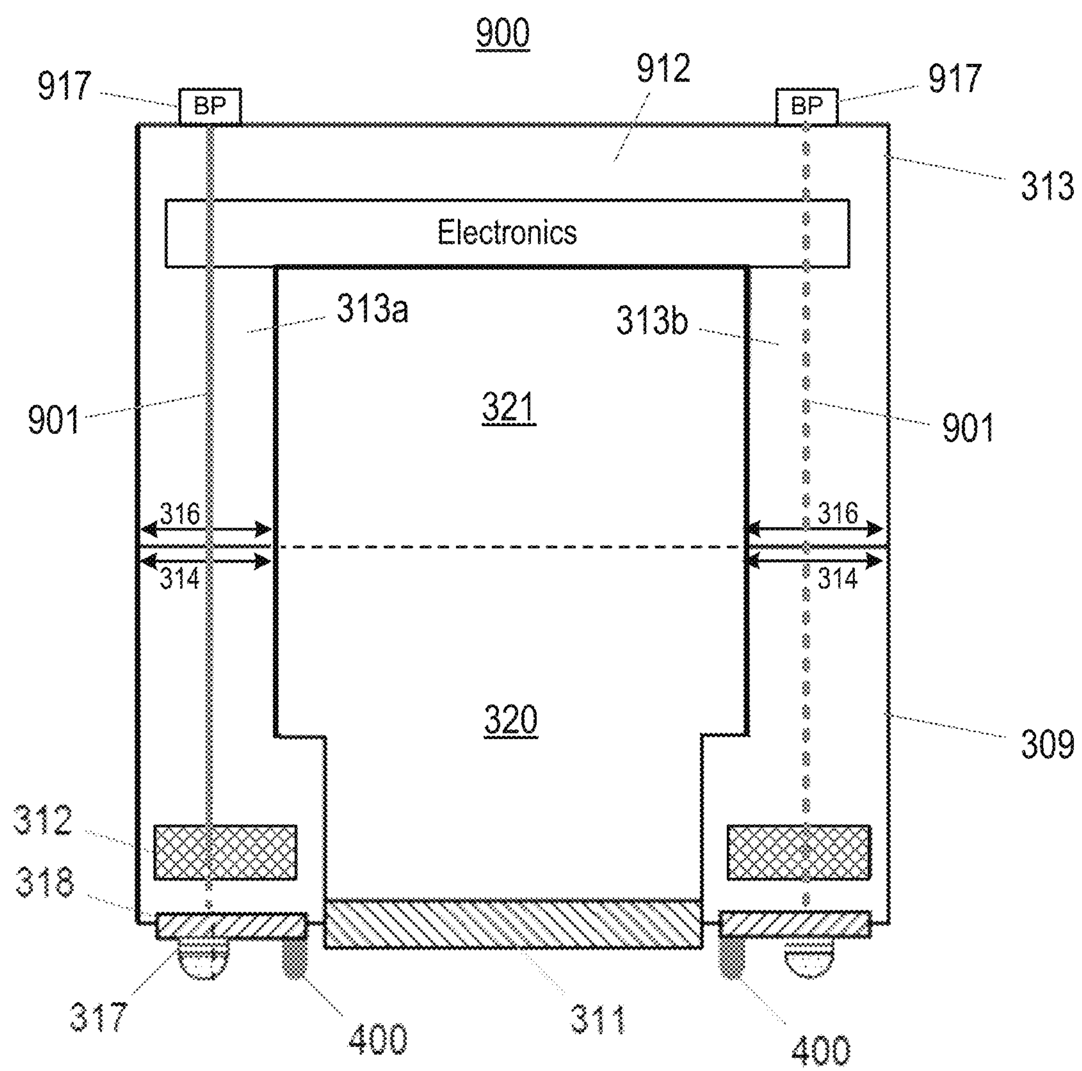
FIG. 10 shows an example of a MEMS transducer package according to another embodiment of the present invention.
Figure 11:
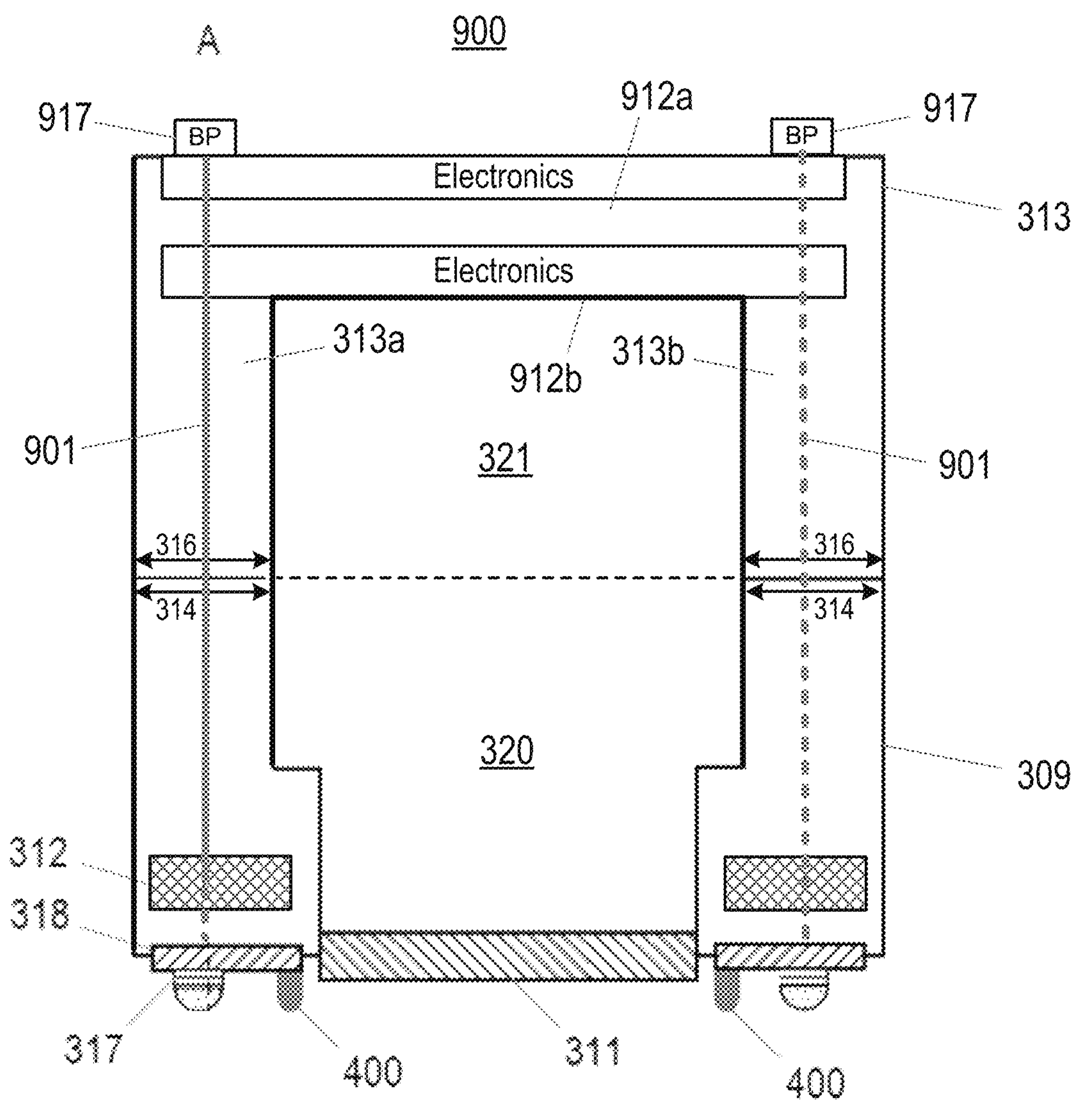
FIG. 11 shows an example of a MEMS transducer package according to another embodiment of the present invention.

FIG. 10 shows a similar example to FIG. 9, but where the integrated electronic circuitry 912 of the package cover 313 is positioned such that it abuts an inner surface of the package cover 313, rather than an outer surface as shown in FIG. 9. It is noted that the MEMS transducer package may comprise integrated electronic circuitry 912*a*, 912*b* which abuts with both the inner and outer surfaces of the package cover 313, as shown in FIG. 11.

It is noted that when both the package cover 313 and integrated circuit die 309 contain integrated electronic circuitry 312/912, the separate integrated electronic circuitry 312/912 may be configured to perform different processing tasks.

Figure 12:
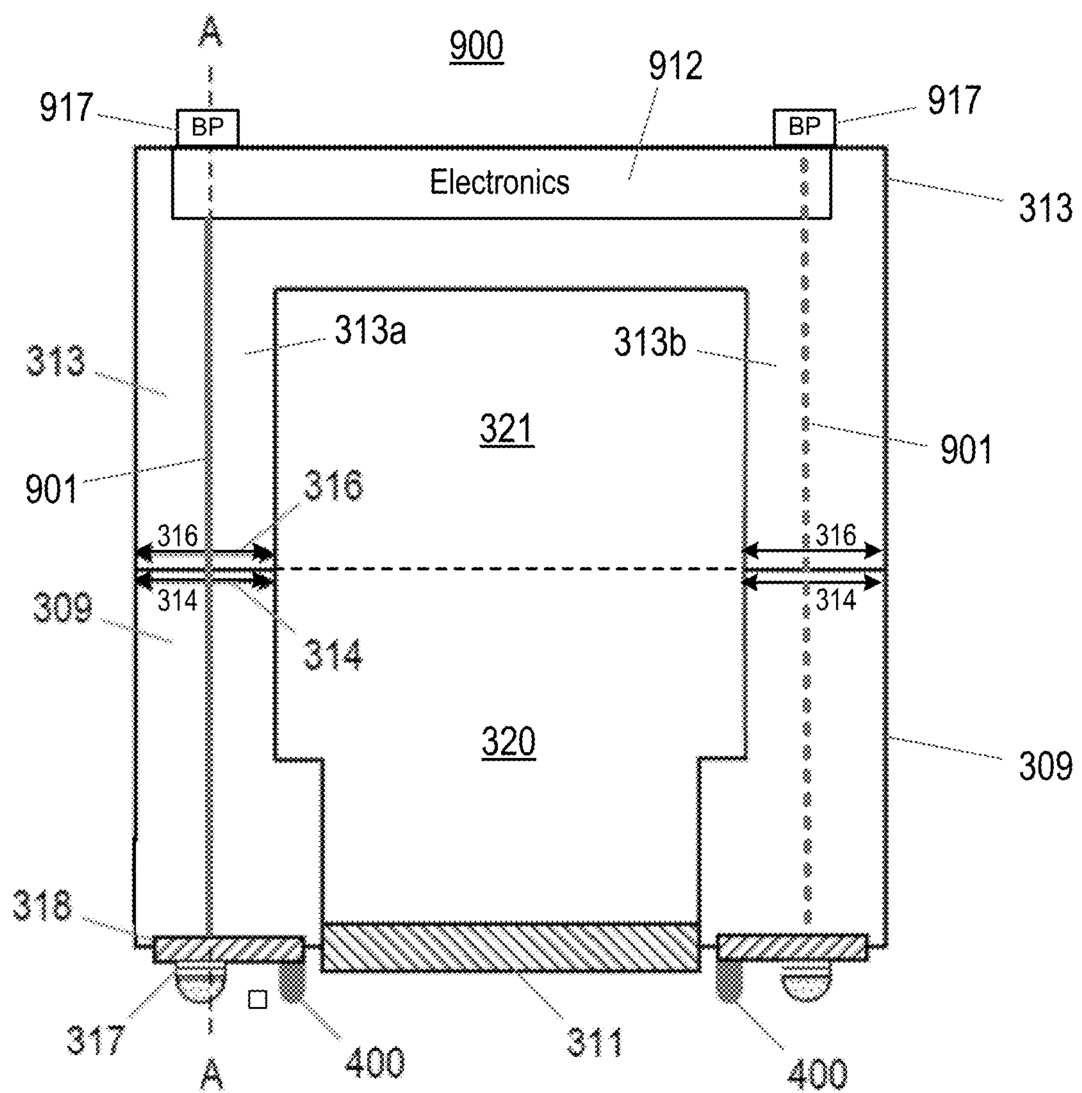
FIG. 12 shows an example of a MEMS transducer package according to another embodiment of the present invention.

FIG. 12 shows yet another example, whereby the integrated circuit die 309 does not comprise any integrated electronic circuitry itself, with the integrated electronic circuitry instead being provided on the package cover 313 only.

According to such an embodiment there is provided a MEMS transducer package 900 comprising a package cover 313, and an integrated circuit die 309 comprising an integrated MEMS transducer 311. The package cover 313 comprises integrated electronic circuitry 912.

It is noted that the package cover 313 and integrated circuit die 309 comprise, for example, separately manufactured sections, for example fabricated in different wafers, which are bonded together to form a wafer level package (WLP), i.e. the MEMS transducer package 900. In an embodiment where the integrated electronic circuitry is provided in the package cover, this enables the package cover to be fabricated using one type of processing technique, for example a 28 nm CMOS processing technique when forming the electronic circuitry, whereas the integrated circuit die may be fabricated using a different processing technique, for example a CMOS processing technique greater than 100 nm.

In one embodiment the integrated electronic circuitry 912 is electrically coupled to the integrated MEMS transducer 311 of the integrated circuit die 309, for example for controlling operation and read out of the integrated MEMS transducer 311.

In the embodiment of FIG. 12, as with other embodiments a footprint of the integrated electronic circuitry 912 of the package cover 313 may at least overlap with a bonding region 314 between the package cover 313 and the integrated circuit die 309.

Figure 13:
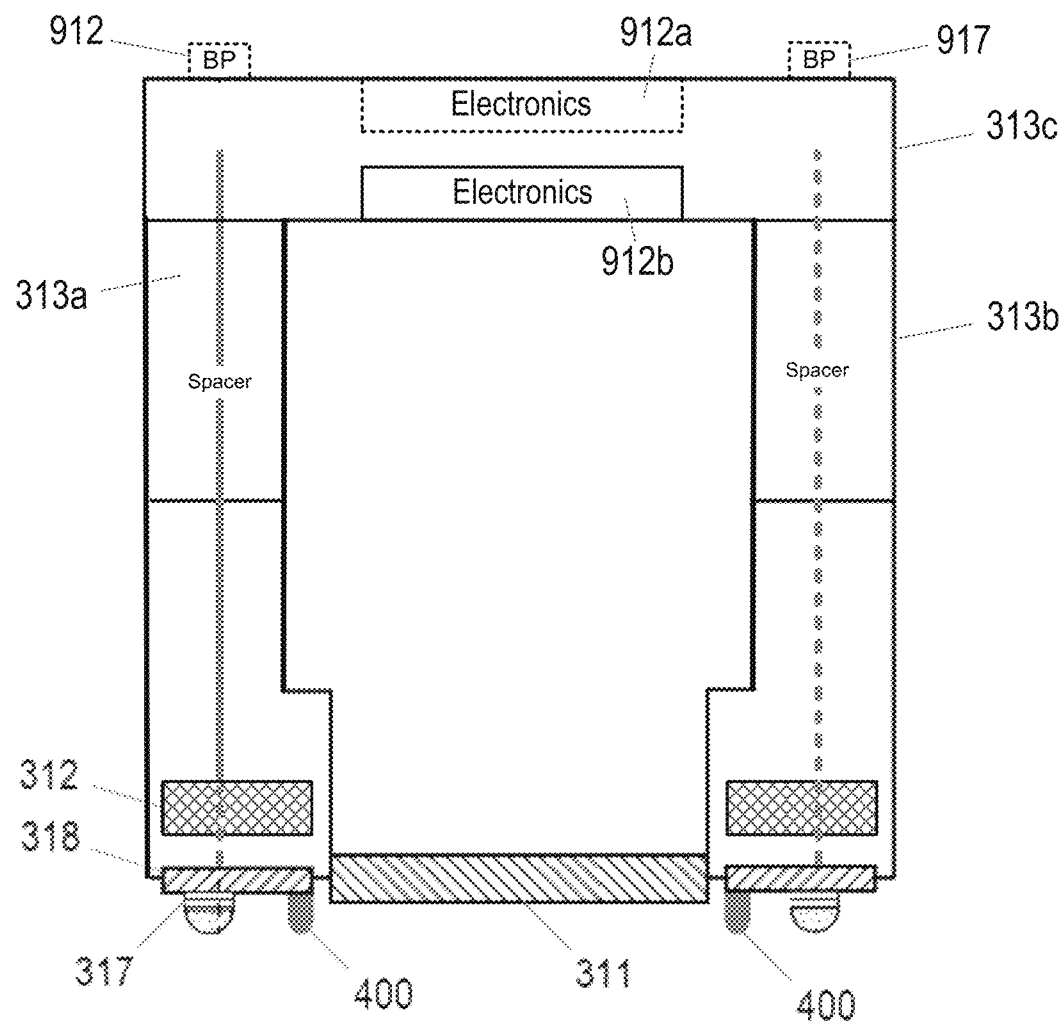
FIG. 13 shows an example of a MEMS transducer package according to another embodiment of the present invention.

FIG. 13 shows an example where the package cover 313 is comprised of separate sections 313*a*, 313*b* and 313*c*, for example separate section of a wafer level package, and wherein the integrated electronic circuitry 912 is formed in one section, e.g. section 313*c*, of the package cover 313.

Figure 14:
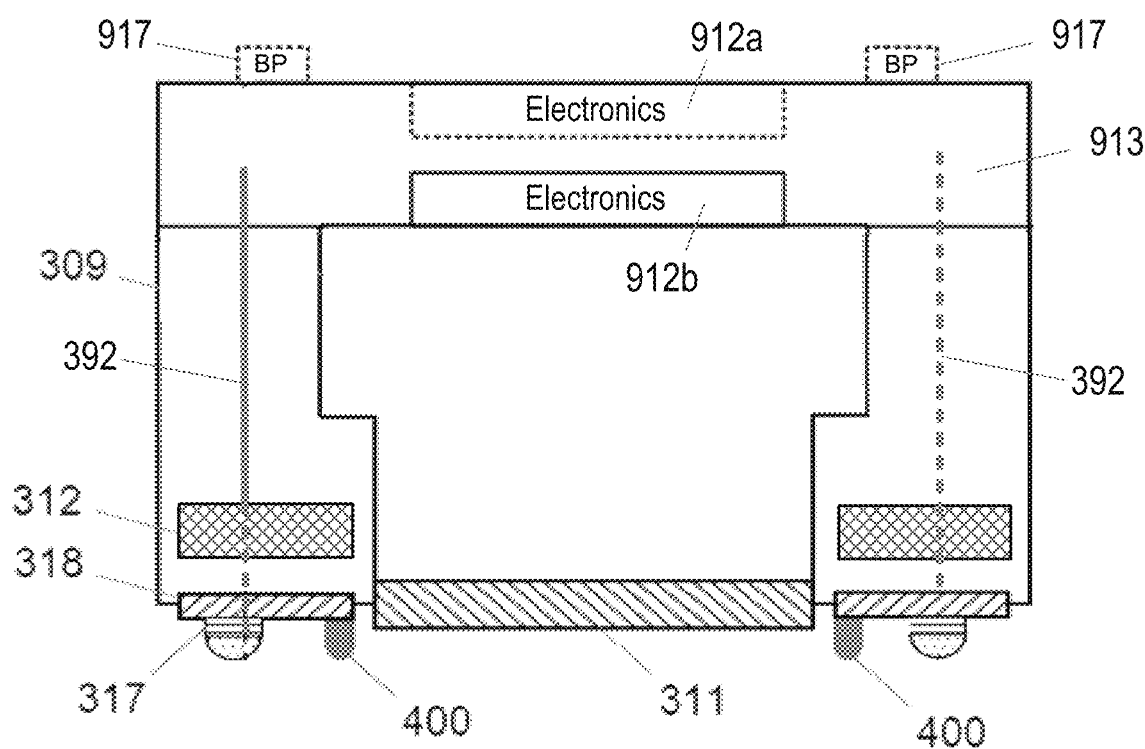
FIG. 14 shows an example of a MEMS transducer package according to another embodiment of the present invention.

FIG. 14 shows an example where a package cover 913 does not comprise a cavity as found in other embodiments, and is instead a planar structure. It is noted that such a package cover 913 may be used with any of the other embodiments described herein. The package cover 913 may comprise integrated electronic circuitry 912 (for example separate sections as shown in this Figure), although it is noted that in other examples only one section of integrated electronic circuitry 912 is provided, as illustrated in FIG. 15.

Figure 15:
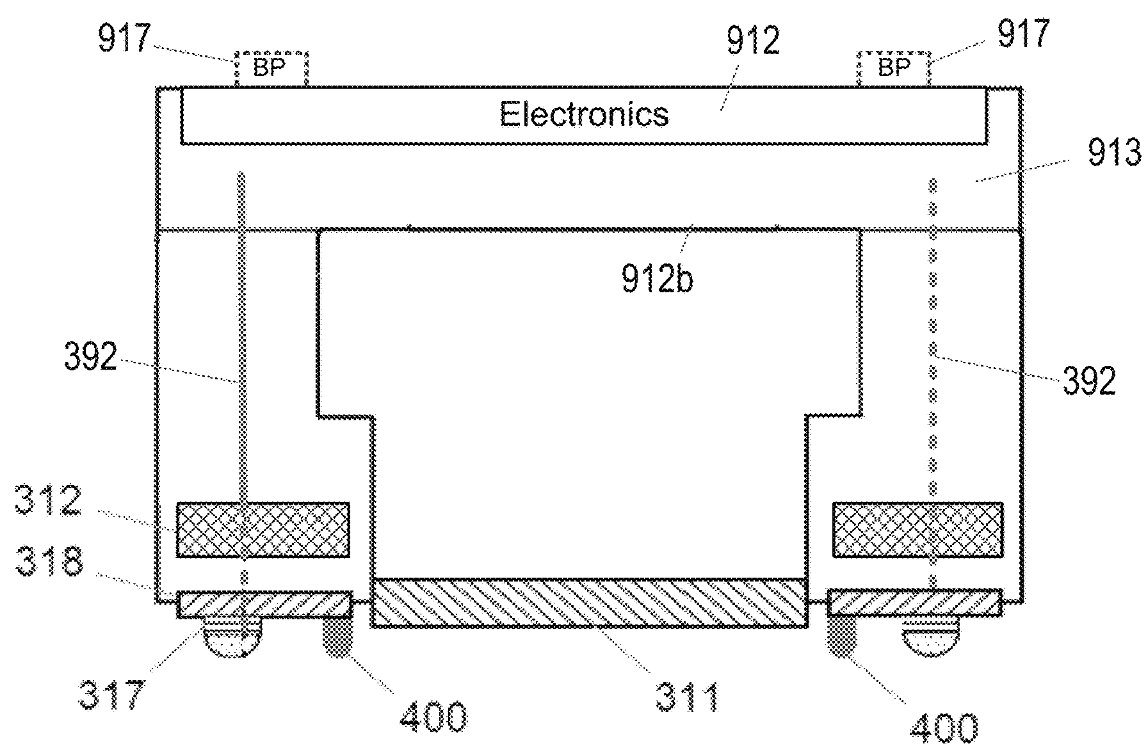
FIG. 15 shows an example of a MEMS transducer package according to another embodiment of the present invention.

It is also noted that, in some examples, the type of planar package cover 913 shown in FIGS. 14 and 15 does not comprise integrated electronic circuitry in the package cover per se. Such a planar package can be used with any of the other embodiments.

From the embodiments described above it can be seen that the integrated electronic circuitry 312 is redistributed (electronic redistribution) in a region of the integrated circuit die 309 (e.g. silicon substrate) that corresponds to the interface between the substrate and the cap or package cover. It will be appreciated that even though the MBW is shown as being the same for both the package cover and integrated circuit die in some of the illustrated embodiments, one arm may have a width that is greater than the MBW of the other arm.

In the embodiments and examples described above, it is noted that the integrated circuit die comprising the MEMS transducer and integrated electronic circuitry may be formed by any suitable processing techniques, for instance by using CMOS compatible MEMS fabrication techniques.

It is noted that, in the embodiments described above, although the bonding structures are shown as being configured or arranged in various corners of a MEMS transducer, the bonding structures may instead be configured in a particular region, for example to one side of a membrane.

It is noted that, as used in this specification, it should be understood that the terms upper and lower should not be in any way construed as limiting to any particular orientation of the transducer during any fabrication step and/or orientation in any package, or indeed the orientation of the package in any apparatus. The relative terms lower, above, below, underside, underneath etc. shall be construed accordingly.

The cavities mentioned in the embodiments above may be configured so as to form at least part of a back volume in use, to allow the transducer membrane to move freely. Transducers such as MEMS microphones may comprise a flexible membrane that can move in response to a pressure differential across the membrane. In use the membrane is typically disposed between first and second volumes, i.e. spaces or cavities that allow the membrane to deflect. Typically the first and second volumes fill with air in use but in some applications the volumes could be filled with some other fluid, gas or liquid suitable for transmission of acoustic waves and/or responding to pressure differences.

It should be noted that the term "back volume" does not define any particular orientation of the transducer die. It should also be noted that the term "back volume" does not denote any particular type of transducer construction. In particular for a MEMS capacitive transducer having a flexible membrane, the flexible membrane will typically support a first electrode relative to a second, substantially fixed, electrode. The second electrode may be supported by a support structure, which is separated from the flexible membrane by a transducer cavity or gap. The support structure supporting the second electrode is sometimes referred to as a "back-plate" and is typically designed to have a relatively low acoustic impedance at the frequencies of interest. In some designs of transducer the "back-plate" may be located above the membrane (when fabricated on the substrate) and thus the cavity in the substrate extends beneath the membrane. In other designs however a "back-plate" may be located under the membrane and the cavity in the die substrate may therefore extend through the die substrate to the membrane.

Embodiments may be implemented in a host device, especially a portable and/or battery powered host device such as a mobile telephone, and audio player, a video player, a PDA, wearable device, a device operable in an Internet-of-Things environment, a mobile computing platform such as a laptop computer or tablet and/or a games device for example or in an accessory device, such a headset, earbud (possibly noise-cancelling), or microphone assembly, designed for wired, or wireless connection with such host devices, possibly via multi-wire cables, multi-pole connectors, or optical fibres and connectors.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

The invention claimed is:

1. A MEMS transducer package comprising:
a package cover; and
an integrated circuit die comprising bond arms for bonding with the package cover, the bond arms defining at least part of a first cavity in the integrated circuit die, and comprising a bonding region for bonding with the package cover,
the integrated circuit die comprising:
an integrated MEMS transducer; and
integrated electronic circuitry in electrical connection with the integrated MEMS transducer;
wherein:
a footprint of the integrated electronic circuitry at least overlaps with the bonding region of the integrated circuit die, wherein the footprint of the integrated electronic circuitry is formed around at least two sides of the integrated MEMS transducer.

2. A MEMS transducer package as claimed in claim 1, wherein the footprint of the integrated electronic circuitry overlaps with at least part of the first cavity of the integrated circuit die.

3. A MEMS transducer package as claimed in claim 1, further comprising an electrical redistribution layer coupled to first surface of the integrated circuit die.

4. A MEMS transducer package as claimed in claim 3, wherein the footprint of the integrated electronic circuitry overlaps with at least part the electrical redistribution layer.

5. A MEMS transducer package as claimed in claim 1, wherein the footprint of the integrated electronic circuitry is formed around at least part of all sides of the integrated MEMS transducer.

6. A MEMS transducer package as claimed in claim 5, wherein the footprint of the integrated electronic circuitry is formed evenly around all sides of the integrated MEMS transducer.

7. A MEMS transducer package as claimed in claim 1, wherein the first cavity comprises a first portion and a second portion, wherein the cross-sectional area of the first portion of the cavity which interfaces with the integrated MEMS transducer is smaller than the cross-sectional area of the second portion of the cavity at a surface of the integrated circuit die that interfaces with the package cover.

8. A MEMS transducer package as claimed in claim 1, wherein the package cover comprises a cavity.

9. A MEMS transducer package as claimed in claim 1, wherein:
the integrated MEMS transducer is formed at a first surface of the integrated circuit die;
the integrated circuit die comprises a cavity, wherein said integrated MEMS transducer at least partly overlaps with the cavity; and
the cavity extends through the first integrated circuit die from the integrated MEMS transducer to an opening at a second surface of the integrated circuit die.

10. A MEMS transducer package as claimed in claim 9 further comprising a cavity formed in the package cover at a surface of the package cover which abuts the second surface of the integrated circuit die, to provide a back volume defined by the cavity in the integrated circuit die and the cavity in the package cover.

11. A MEMS transducer package comprising:

a package cover; and an integrated circuit die comprising bond arms for bonding with the package cover, the bond arms defining at least part of a first cavity in the integrated circuit die, and comprising a bonding region for bonding with the package cover, the integrated circuit die comprising:

an integrated MEMS transducer spanning the first cavity; and integrated electronic circuitry in electrical connection with the integrated MEMS transducer;

wherein:

at least one plane along a longitudinal direction of the bond arms and through the integrated circuit die passes through the integrated electronic circuitry and the bonding region of the integrated circuit die on a first side of the integrated MEMS transducer, and one plane along a longitudinal direction of the bond arms and through the integrated circuit die (309) passes through the integrated electronic circuitry (312) and the bonding region (314) of the integrated circuit die on a second side of the integrated MEMS transducer.

12. A MEMS transducer package as claimed in claim 11, wherein the integrated circuit die further comprises an electrical redistribution layer, and wherein at least one plane through the integrated circuit die passes through the integrated electronic circuitry, the bonding region and the electrical redistribution layer of the integrated circuit die.

13. A MEMS transducer package as claimed in claim 11, further comprising a sealing element or an acoustic sealing element on an outer surface of the integrated circuit die, the sealing element or acoustic sealing element surrounding the MEMS transducer.

14. A MEMS transducer package as claimed in claim 1, wherein the integrated MEMS transducer comprises multiple individual MEMS transducers on the integrated circuit die.

15. A MEMS transducer package as claimed in claim 1, wherein said MEMS transducer is a MEMS microphone.

* * * * *